(12) United States Patent
Kim

(10) Patent No.: US 11,307,942 B2
(45) Date of Patent: Apr. 19, 2022

(54) MEMORY SYSTEM, MEMORY CONTROLLER AND METHOD FOR OPERATING MEMORY CONTROLLER

(71) Applicant: SK hynix Inc., Gyeonggi-do (KR)

(72) Inventor: Jin Pyo Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 224 days.

(21) Appl. No.: 16/867,199

(22) Filed: May 5, 2020

(65) Prior Publication Data

US 2021/0133058 A1 May 6, 2021

(30) Foreign Application Priority Data

Oct. 31, 2019 (KR) .................. 10-2019-0137158

(51) Int. Cl.
*G06F 11/00* (2006.01)
*G06F 11/20* (2006.01)
(Continued)

(52) U.S. Cl.
CPC ............ *G06F 11/2015* (2013.01); *G06F 1/30* (2013.01); *G06F 11/076* (2013.01);
(Continued)

(58) Field of Classification Search
CPC ............ G06F 11/0751; G06F 11/0754; G06F 11/076; G06F 11/0766; G06F 11/0772; G06F 11/2015; G06F 11/2017; G06F 11/30; G06F 11/3003; G06F 11/3037; G06F 11/3058; G06F 11/3065; G06F 1/26; G06F 1/28; G06F 1/30; G06F 1/305; G06F 12/0246; G06F 2212/1032; G06F 2212/7201; G06F 2212/7203; G06F 2212/7204; G06F 2212/7208; G06F 3/0638; G06F 3/064; G06F 3/0644; G06F 3/0658; G06F 3/0679; G11C 5/005; G11C 5/141; G11C 5/143; G11C 5/148; G11C 16/26; G11C 16/30; G11C 2029/0411
See application file for complete search history.

(56) References Cited

U.S. PATENT DOCUMENTS 7,937,521 B2 * 5/2011 Reid .................. G06F 12/0246
711/100
9,230,689 B2 * 1/2016 Tuers .................. G11C 16/102
(Continued)

FOREIGN PATENT DOCUMENTS

KR 10-2013-0034830 4/2013
KR 10-2020-0001158 1/2020

*Primary Examiner* — Anthony J Amoroso
(74) *Attorney, Agent, or Firm* — IP & T Group LLP

(57) ABSTRACT

A memory system, a memory controller and an operating method are disclosed. By dividing a read count table including read count values respectively for a plurality of memory blocks into one or more read count table segments each including one or more read count values of a resolution, and managing one or more flags respectively corresponding to the read count table segments, and set the flag corresponding to the read count table segment in which at least one read count value is changed among the read count table segments, it is possible to minimize additional operational costs required to recover the read count table upon occurrence of an SPO.

17 Claims, 17 Drawing Sheets

(51) Int. Cl.
  *G06F 11/07*   (2006.01)
  *G06F 12/02*   (2006.01)
  *G06F 11/30*   (2006.01)
  *G06F 1/30*    (2006.01)

(52) U.S. Cl.
  CPC ...... *G06F 11/3037* (2013.01); *G06F 11/3058* (2013.01); *G06F 12/0246* (2013.01)

(56) References Cited

U.S. PATENT DOCUMENTS

| | | | |
|---|---|---|---|
| 9,971,682 B2* | 5/2018 | Li | G06F 3/0616 |
| 10,854,302 B2* | 12/2020 | Asano | G11C 8/12 |
| 10,950,317 B2* | 3/2021 | Muchherla | G11C 16/3418 |
| 2013/0138871 A1* | 5/2013 | Chiu | G06F 11/2094 |
| | | | 711/103 |

* cited by examiner

ND METHOD FOR
MEMORY SYSTEM, MEMORY CONTROLLER AND METHOD FOR OPERATING MEMORY CONTROLLER

CROSS-REFERENCE TO RELATED APPLICATION

The present application claims priority under 35 U.S.C. 119(a) to Korean Patent Application No. 10-2019-0137158 filed on Oct. 31, 2019, which is incorporated herein by reference in its entirety.

BACKGROUND

1. Technical Field

Various embodiments generally relate to a memory system, a memory controller and a method for operating the memory controller.

2. Related Art

A memory system corresponding to a storage device is a device which stores data based on a request of a host, such as a computer, a mobile terminal such as a smartphone and a tablet, or various electronic devices. The memory system may include not only a device which stores data in a magnetic disk, such as a hard disk drive (HDD), but also a device which stores data in a nonvolatile memory, such as a solid state drive (SDD), a universal flash storage (UFS) device and an embedded MMC (eMMC) device.

The memory system may further include a memory controller for controlling a memory device (e.g., a volatile memory/a nonvolatile memory). The memory controller may receive a command from the host, and may perform or control an operation for reading, writing or erasing data with respect to the memory device included in the memory system, based on the received command. The memory controller may drive a firmware for performing logical calculations to execute or control these operations.

The memory system manages a read count table which stores information on the number of times data is read, while reading the data from the memory device. Even when an SPO (sudden power-off) occurs in the memory system, the read count table may be recovered to a state before the SPO. Additional operational costs are required to implement a memory system having a read count table which is capable of being recovered when a SPO occurs. To alleviate those operational costs a read count table which is divided into read count table segments is proposed.

SUMMARY

Various embodiments are directed to a memory system, a memory controller and an operating method capable of minimizing additional operational costs required to recover a read count table upon occurrence of an SPO.

In one aspect, embodiments of the disclosure may provide a memory system including: a memory device including a plurality of memory blocks; and a memory controller.

The memory controller may divide a read count table including read count values respectively for the plurality of memory blocks into one or more read count table segments each including one or more read count values wherein the number of read count values for a read count table segment is a resolution.

The memory controller may manage one or more flags respectively corresponding to the read count table segments.

The memory controller may set the flag corresponding to the read count table segment in which at least one read count value in a read count table segment is changed.

The memory controller may determine a number of the read count values to be included in each of the read count table segments based on charge capacity of a power supply device which supplies emergency power to the memory controller when an SPO occurs.

The memory controller may record, when a number of the set flags is equal to or greater than a threshold, the read count table segment corresponding to the set flags in the first area, wherein the memory device may include a first area.

The memory controller may reset the flag corresponding to the read count table segment which is recorded in the first area.

The memory controller may record, when an SPO occurs, the read count table segment corresponding to set flags in the second area, wherein the memory device may include a second area.

The memory controller may update, in an SPO recovery operation, the read count table based on the read count table segments recorded in the second area.

In another aspect, embodiments of the disclosure may provide a memory controller including: a memory interface configured to communicate with a memory device including a plurality of memory blocks; and a control circuit.

The control circuit may divide a read count table including read count values respectively for the plurality of memory blocks into one or more read count table segments each including one or more read count values of a resolution.

The control circuit may manage one or more flags respectively corresponding to the one or more read count table segments.

The control circuit may set the flag corresponding to the read count table segment, in which at least one read count value is changed, among the read count table segments.

The control circuit may determine a number of the read count values to be included in each of the read count table segments based on charge capacity of a power supply device which supplies emergency power to the memory controller when a sudden power off (SPO) occurs.

The control circuit may record, when a number of set flags is equal to or greater than a threshold, at least one read count table segment corresponding to the set flags in a first area in the memory device.

The control circuit may reset the set flag corresponding to the read count table segment which is recorded in the first area.

The control circuit may record, when an SPO occurs, the read count table segments corresponding to set flags in a second area in the memory device.

The control circuit may update, in an SPO recovery operation, the read count table based on the read count table segments recorded in the second area.

In still another aspect, embodiments of the disclosure may provide a method for operating a memory controller, including: dividing a read count table including read count values respectively for the plurality of memory blocks into one or more read count table segments each including one or more read count values of a resolution.

The method for operating a memory controller may include managing one or more flags respectively corresponding to the one or more read count table segments.

In the managing of the one or more flags, the memory controller may set the flag corresponding to the read count table segment, in which at least one read count value is changed, among the read count table segments.

In still another aspect, embodiments of the disclosure may provide a memory system, including: a memory device including a plurality of memory blocks; a memory configured to store one or more groups of read count values respectively corresponding to the memory blocks and one or more flags respectively corresponding to the groups; and a control circuitry.

The control circuitry may set, whenever any among the read count value changes, a corresponding flag among the flags.

The control circuitry may dump, when a number of the set flags reaches a threshold, the groups corresponding to the set flags into the memory device while resetting the set flags.

In still another aspect, embodiments of the disclosure may provide a memory system, including: a memory device including a plurality of memory blocks; a memory configured to store one or more groups of read count values respectively corresponding to the memory blocks and one or more flags respectively corresponding to the groups; and a control circuitry.

The control circuitry may set, whenever any among the read count values changes, a corresponding flag among the flags.

The control circuitry may dump, when a sudden power off occurs, the group corresponding to the set flag into the memory device.

The control circuitry may recover, during a sudden power off recovery, the groups stored in the memory based on the dumped group.

According to the embodiments of the disclosure, it is possible to minimize additional operational costs which are required to recover a read count table upon occurrence of an SPO.

DETAILED DESCRIPTION

Hereinafter, various examples of embodiments of the disclosure will be described in detail with reference to the accompanying drawings.

Figure 1:
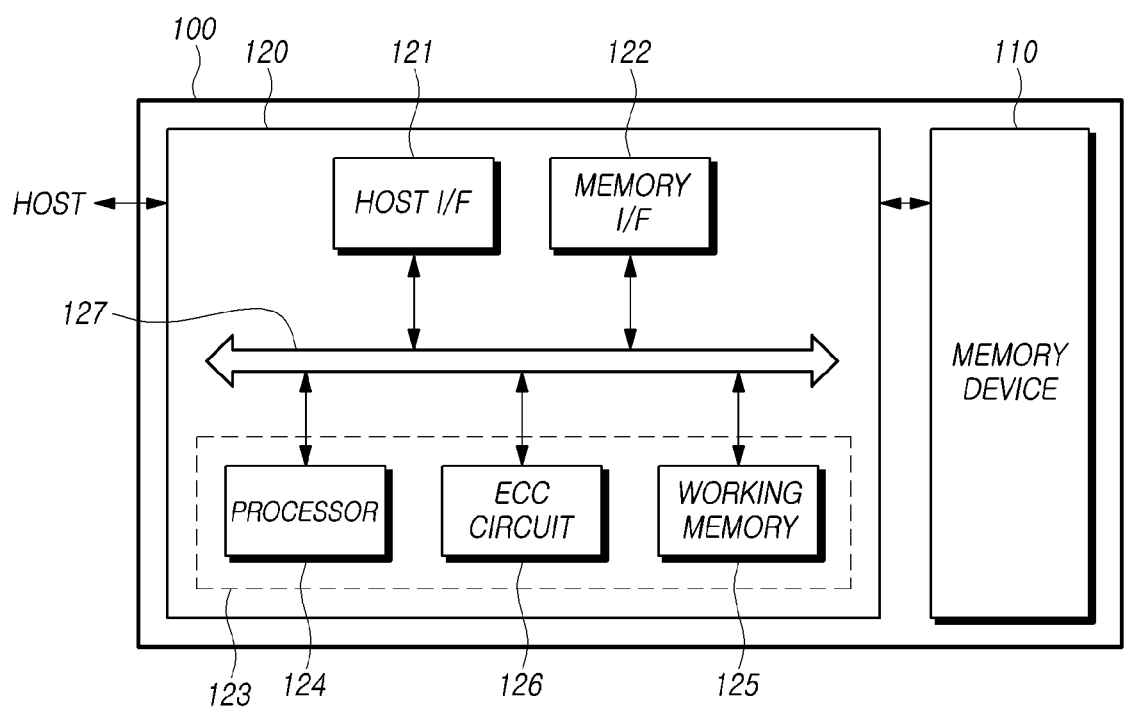
FIG. 1 is a schematic configuration diagram illustrating an example of a memory system in accordance with embodiments of the disclosure.

FIG. 1 is a configuration diagram schematically illustrating a representation of an example of a memory system 100 in accordance with embodiments of the disclosure.

Referring to FIG. 1, the memory system 100 in accordance with the embodiments of the disclosure may include a memory device 110 which stores data, and a memory controller 120 which controls the memory device 110.

The memory device 110 includes a plurality of memory blocks, and operates in response to the control of the memory controller 120. Operations of the memory device 110 may include, for example, a read operation, a program operation (also referred to as a write operation) and an erase operation.

The memory device 110 may include a memory cell array including a plurality of memory cells (also simply referred to as "cells") which store data. Such a memory cell array may exist in memory blocks.

For example, the memory device 110 may be realized as various types such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and a spin transfer torque random access memory (SU-RAM).

The memory device 110 may be realized in a three-dimensional array structure. The embodiments of the disclosure may be applied to not only a flash memory device in which a charge storage layer is configured by a conductive floating gate but also a charge trap flash (CTF) in which a charge storage layer is configured by a dielectric layer.

The memory device 110 is configured to receive a command, an address and so forth from the memory controller 120, and access a region in the memory cell array which is selected by the address. That is, the memory device 110 may perform an operation corresponding to the command, for a region selected by the address.

For example, the memory device 110 may perform a program operation, a read operation and an erase operation. In this connection, in the program operation, the memory device 110 may program data to a region selected by the address. In the read operation, the memory device 110 may read data from a region selected by the address. In the erase operation, the memory device 110 may erase data stored in a region selected by the address.

The memory controller 120 may control write (program), read, erase and background operations for the memory device 110. For example, the background operation may include at least one of a garbage collection (GC) operation, a wear leveling (WL) operation, a bad block management (BBM) operation, and so forth.

The memory controller 120 may control the operation of the memory device 110 according to a request of a host. Alternatively, the memory controller 120 may control the operation of the memory device 110 regardless of a request of the host.

Furthermore, the memory controller 120 and the host may be devices which are separated from each other. As the case may be, the memory controller 120 and the host may be realized by being integrated into one device. Hereunder, it will be described as an example that the memory controller 120 and the host are devices which are separated from each other.

Referring to FIG. 1, the memory controller 120 may include a memory interface 122 and a control circuit 123, and may further include a host interface 121.

The host interface 121 provides an interface for communication with the host.

When receiving a command from the host, the control circuit 123 may receive the command through the host interface 121, and then, may perform an operation of processing the received command.

The memory interface 122 is coupled with the memory device 110 and thereby provides an interface for communication with the memory device 110. That is, the memory interface 122 may be configured to provide the interface between the memory device 110 and the memory controller 120 in response to the control of the control circuit 123.

The control circuit 123 performs the general control operations of the memory controller 120, thereby controlling the operations of the memory device 110. To this end, for instance, the control circuit 123 may include at least one of a processor 124 and a working memory 125, and as the case may be, may further include an error detection and correction circuit (ECC circuit) 126.

The processor 124 may control general operations of the memory controller 120, and may perform a logic calculation. The processor 124 may communicate with the host through the host interface 121, and may communicate with the memory device 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the received logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 is configured to randomize data received from the host. For example, the processor 124 may randomize data received from the host, by using a randomizing seed. Randomized data which is to be stored, is provided to the memory device 110 and is programmed to the memory cell array.

The processor 124 is configured to derandomize data received from the memory device 110, in a read operation. For example, the processor 124 may derandomize data received from the memory device 110, by using a derandomizing seed. Derandomized data may be outputted to the host.

The processor 124 may control the operation of the memory controller 120 by executing firmware. In order to control general operations of the memory controller 120 and perform a logic calculation, the processor 124 may execute (drive) firmware loaded to the working memory 125 upon booting.

The firmware is a program to be executed in the memory system 100 and may include various functional layers.

For example, the firmware may include at least one among a flash translation layer (FTL) which performs a translating function between a logical address requested to the memory system 100 from the host and a physical address of the memory device 110, a host interface layer (HIL) which serves to analyze a command requested to the memory system 100 as a storage device from the host and to transfer the analyzed command to the flash translation layer (FTL), a flash interface layer (FIL) which transfers a command instructed from the flash translation layer (FTL) to the memory device 110, and so forth.

For instance, such firmware may be stored in the memory device 110 and then be loaded to the working memory 125.

The working memory 125 may store firmware, a program code, a command and data which are necessary to drive the memory controller 120. The working memory 125, for example, as a volatile memory, may include at least one among an SRAM (static RAM), a DRAM (dynamic RAM) and an SDRAM (synchronous DRAM).

The error detection and correction circuit 126 may be configured to detect an error bit of checking target data and correct the detected error bit, by using an error correction code. Here, the checking target data may be, for example, data stored in the working memory 125, data read from the memory device 110, or the like.

The error detection and correction circuit 126 may be realized to decode data by using an error correction code. The error detection and correction circuit 126 may be realized by various code decoders. For example, a decoder which performs unsystematic code decoding or a decoder which performs systematic code decoding may be used.

For example, the error detection and correction circuit 126 may detect an error bit for each read data, in the unit of sector. Namely, each read data may be constituted by a plurality of sectors. A sector may mean a data unit smaller than a page as a read unit of a flash memory. Sectors constituting each read data may be matched with one another by an address.

The error detection and correction circuit 126 may calculate a bit error rate (BER), and may determine whether an error is correctable or not, in the unit of sector. For example, in the case where a bit error rate (BER) is higher than a reference value, the error detection and correction circuit 126 may determine that a corresponding sector is uncorrectable or a fail. On the other hand, in the case where a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, the error detection and correction circuit 126 may detect a sector which is determined to be uncorrectable to the last sector. There may be one or more sectors that are determined to be uncorrectable. The error detection and correction circuit 126 may transfer information (for example, address information) on a sector which is determined to be uncorrectable, to the processor 124.

A bus 127 may be configured to provide channels among the components 121, 122, 124, 125 and 126 of the memory controller 120. The bus 127 may include, for example, a control bus for transferring various control signals, commands and the likes, and a data bus for transferring various data, and so forth.

The above-described components 121, 122, 124, 125 and 126 of the memory controller 120 are for an illustration purpose only. Some of the above-described components 121, 122, 124, 125 and 126 of the memory controller 120 may be omitted, or some of the above-described components 121, 122, 124, 125 and 126 of the memory controller 120 may be integrated into one. As the case may be, in addition to the above-described components 121, 122, 124, 125 and 126 of the memory controller 120, one or more other components may be added.

Hereinbelow, the memory device 110 will be described in further detail with reference to FIG. 2.

Figure 2:
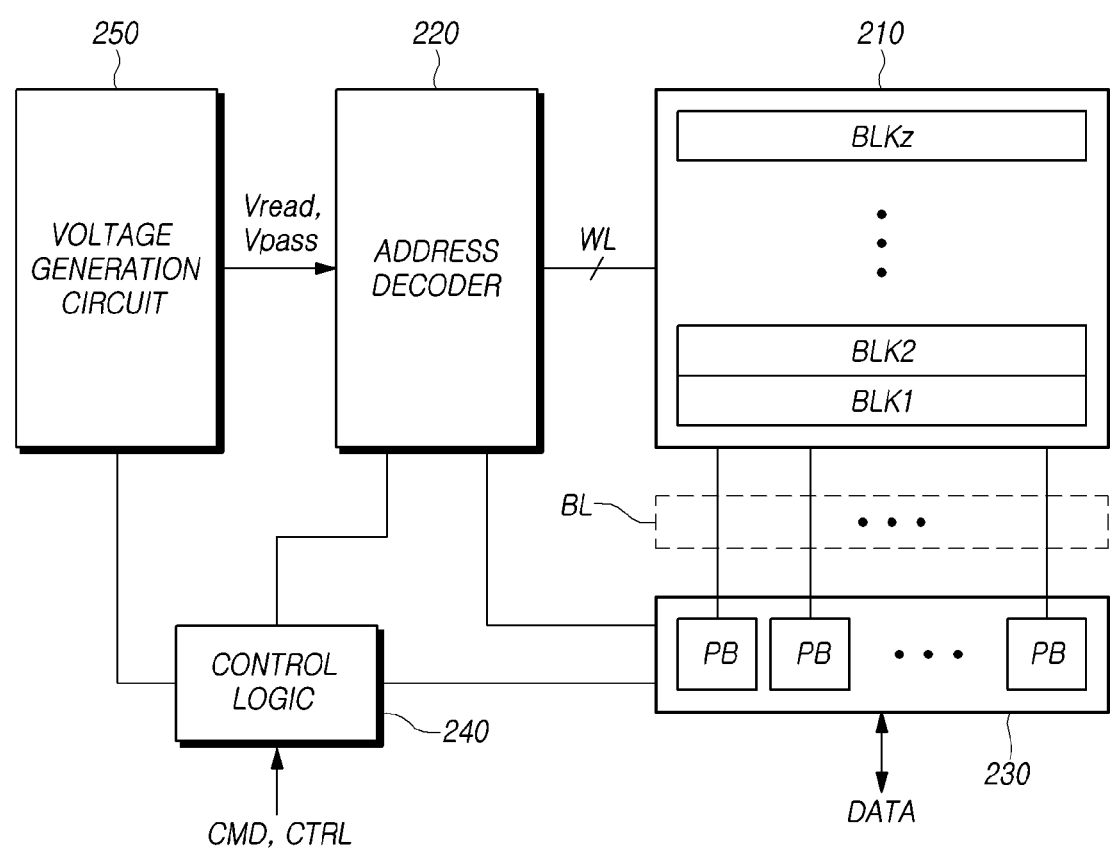
FIG. 2 is a block diagram schematically illustrating an example of a memory device in accordance with the embodiments of the disclosure.

FIG. 2 is a block diagram schematically illustrating an example of the memory device 110 in accordance with the embodiments of the disclosure.

Referring to FIG. 2, the memory device 110 in accordance with the embodiments may include a memory cell array 210, an address decoder 220, a read and write circuit 230, a control logic 240, and a voltage generation circuit 250.

The memory cell array 210 may include a plurality of memory blocks BLK1 to BLKz where z is a natural number of 2 or greater.

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells which have vertical channel structures.

The memory cell array 210 may be configured by a memory cell array of a two-dimensional structure, or as the case may be, may be configured by a memory cell array of a three-dimensional structure.

Each of the plurality of memory cells included in the memory cell array 210 may store at least 1-bit data. For instance, each of the plurality of memory cells included in the memory cell array 210 may be a signal level cell (SLC) which stores 1-bit data. For another instance, each of the plurality of memory cells included in the memory cell array 210 may be a multi-level cell (MLC) which stores 2-bit data. For still another instance, each of the plurality of memory cells included in the memory cell array 210 may be a triple level cell (TLC) which stores 3-bit data. For yet another instance, each of the plurality of memory cells included in the memory cell array 210 may be a quad level cell (QLC) which stores 4-bit data. For still yet another instance, the memory cell array 210 may include a plurality of memory cells, each of which stores 5 or more-bit data.

Referring to FIG. 2, the address decoder 220, the read and write circuit 230, the control logic 240 and the voltage generation circuit 250 may operate as peripheral circuits which drive the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory device 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block in a read voltage applying operation during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory device 110 may be performed in the unit of page. An address received when a read operation or a program operation is requested may include at least one among a block address, a row address and a column address.

The address decoder 220 may select one memory block and one word line depending on a block address and a row address. A column address may be decoded by the address decoder 220 and be provided to the read and write circuit 230.

The address decoder 220 may include at least one among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit which includes a plurality of page buffers PB. The read and write circuit 230 may include data buffers which take charge of a data processing function, and as the case may be, may further include cache buffers which take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, when the amounts of current flowing depending on the programmed states of the corresponding memory cells are changed.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory device 110. As an exemplary embodiment, the read and write circuit 230 may include a column select circuit and so forth in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory device 110.

The control logic 240 may be configured to control general operations of the memory device 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Figure 3:
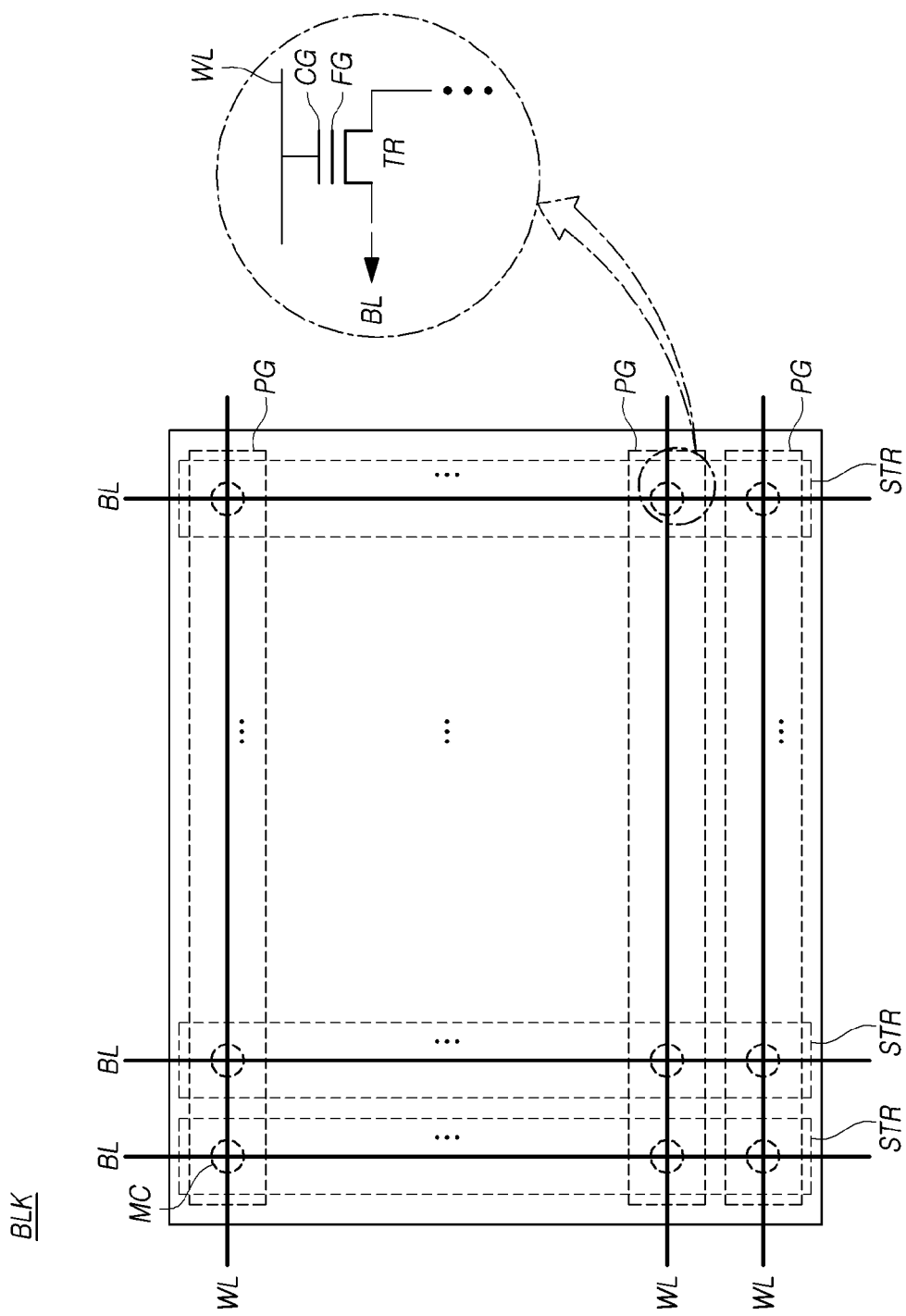
FIG. 3 is a diagram schematically illustrating an example of each memory block of the memory device in accordance with the embodiments of the disclosure.

FIG. 3 is a diagram schematically illustrating an example of each memory block BLK of the memory device 110 in accordance with the embodiments of the disclosure.

Referring to FIG. 3, the memory block BLK included in the memory device 110 may be configured, for example, as a plurality of pages PG and a plurality of strings STR are disposed in directions intersecting with each other.

The plurality of pages PG correspond to a plurality of word lines WL, and the plurality of strings STR correspond to a plurality of bit lines BL.

In the memory block BLK, the plurality of word lines WL and the plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

As the plurality of word lines WL and the plurality of bit lines BL intersect with each other, a plurality of memory cells MC may be defined. A transistor TR may be disposed in each memory cell MC.

For example, the transistor TR disposed in each memory cell MC may include a drain, a source and a gate. The drain (or source) of the transistor TR may be coupled with a corresponding bit line BL directly or via another transistor TR. The source (or drain) of the transistor TR may be coupled with a source line (which may be the ground) directly or via another transistor TR. The gate of the transistor TR may include a floating gate FG which is surrounded by a dielectric and a control gate CG to which a gate voltage is applied from a word line WL.

In each of the plurality of memory blocks BLK1 to BLKz, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

As the case may be, at least one dummy word line may be additionally disposed between the first outermost word line and the first select line. At least one dummy word line may also be additionally disposed between the second outermost word line and the second select line.

When the memory device 110 has a memory block structure as illustrated in FIG. 3, a read operation and a program operation (write operation) may be performed in the unit of page, and an erase operation may be performed in the unit of memory block.

Figure 4:
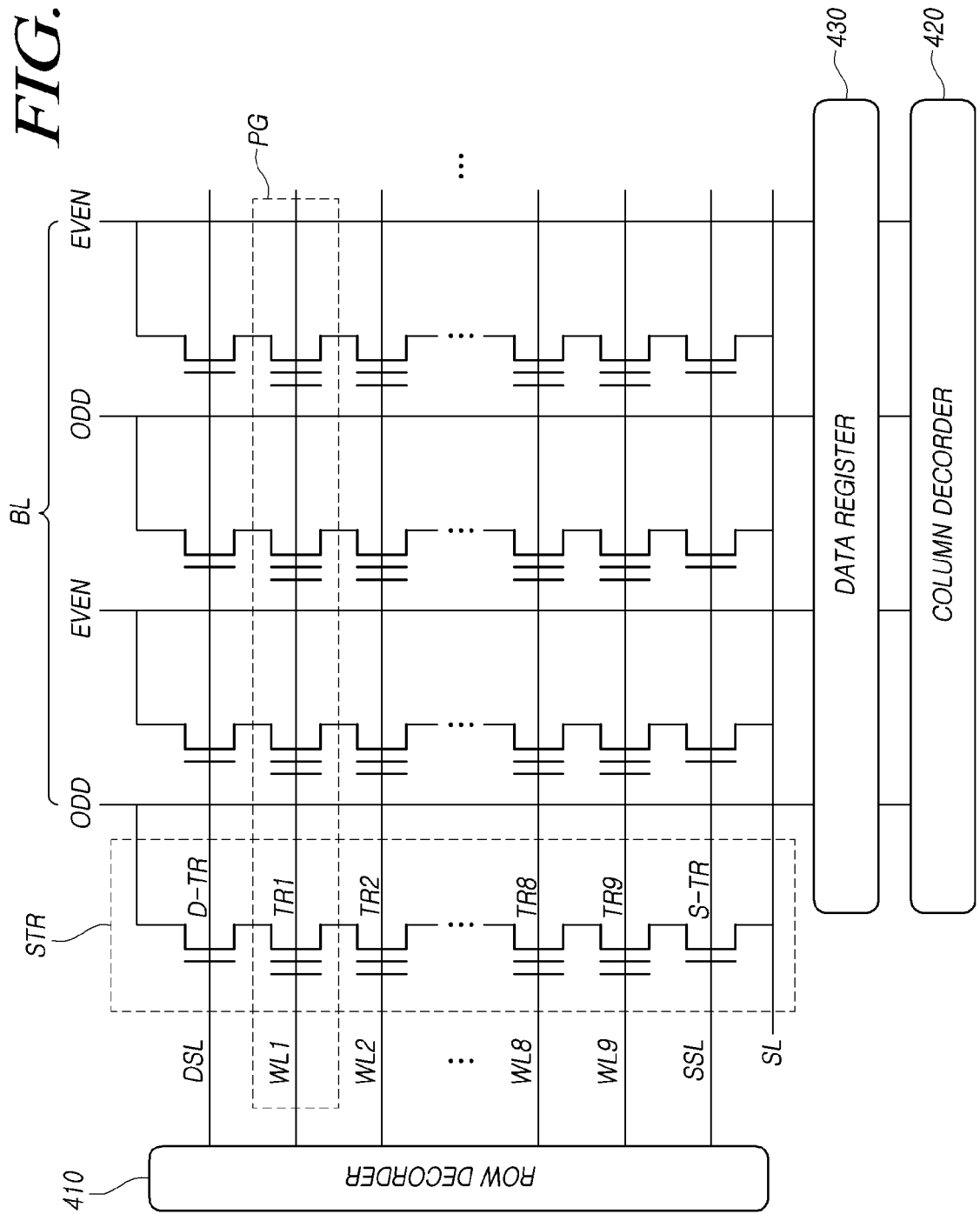
FIG. 4 is a diagram illustrating an example of a structure of word lines and bit lines of the memory device in accordance with the embodiments of the disclosure.

FIG. 4 is a diagram illustrating an example of a structure of word lines WL and bit lines BL of the memory device 110 in accordance with the embodiments of the disclosure.

Referring to FIG. 4, in the memory device 110, there exists a core area in which memory cells MC are gathered and an auxiliary area which corresponds to the remaining area except the core area and supports the operation of the memory cell array 210.

The core area may be configured by pages PG and strings STR. In such a core area, a plurality of word lines WL1 to WL9 and a plurality of bit lines BL are disposed to intersect with each other.

The plurality of word lines WL1 to WL9 may be coupled with a row decoder 410, and the plurality of bit lines BL may be coupled with a column decoder 420. A data register 430 corresponding to the read and write circuit 230 may exist between the plurality of bit lines BL and the column decoder 420.

The plurality of word lines WL1 to WL9 correspond to a plurality of pages PG.

For example, as illustrated in FIG. 4, each of the plurality of word lines WL1 to WL9 may correspond to one page PG. Alternatively, in the case where the size of each of the plurality of word lines WL1 to WL9 is large, each of the plurality of word lines WL1 to WL9 may correspond to at least two (for example, two or four) pages PG. Page PG is a minimum unit used in performing a program operation and a read operation. In the program operation and the read operation, all memory cells MC in the same page PG may simultaneously perform the corresponding operations.

The plurality of bit lines BL may be coupled with the column decoder 420 while being identified as odd-numbered bit lines BL and even-numbered bit lines BL.

To access memory cells MC, first, an address may be entered into the core area through the row decoder 410 and the column decoder 420 via an input/output terminal, and may designate target memory cells. Designating target memory cells means accessing memory cells MC positioned at sites where the word lines WL1 to WL9 coupled with the row decoder 410 and the bit lines BL coupled with the column decoder 420 intersect with each other, to program data to the memory cells MC or read out programmed data from the memory cells MC.

A page PG in a first direction (e.g., an X-axis direction) is bound (coupled) by a common line which is referred to as a word line WL, and a string STR in a second direction (e.g., a Y-axis direction) is bound (coupled) by a common line which is referred to as a bit line BL. Being bound in common means that corresponding memory cells MC are structurally coupled with one another by the same material and the same voltage is simultaneously applied to the memory cells MC when a voltage is applied thereto. Of course, since a memory cell MC which is coupled in series and is positioned at an intermediate position or a last position is influenced by a voltage drop in a preceding memory cell MC, voltages applied to a first memory cell MC and a last memory cell MC may be slightly different from each other.

Since data is programmed and read via the data register 430 in all data processing operations of the memory device 110, the data register 430 plays a key role. If data processing of the data register 430 is delayed, all the other areas need to wait until the data register 430 completes the data processing. Also, if the performance of the data register 430 is degraded, the overall performance of the memory device 110 may be degraded.

Referring to the illustration of FIG. 4, in one string STR, a plurality of transistors TR1 to TR9 which are coupled with the plurality of word lines WL1 to WL9 may exist. Areas where the plurality of transistors TR1 to TR9 exist correspond to memory cells MC. The plurality of transistors TR1 to TR9 are transistors each of which includes a control gate CG and a floating gate FG as described above.

The plurality of word lines WL1 to WL9 include two outermost word lines WL1 and WL9. A first select line DSL may be additionally disposed outside a first outermost word line WL1 which is is more adjacent to the data register 430 in terms of signal path between the two outermost word lines WL1 and WL9, and a second select line SSL may be additionally disposed outside a second outermost word line WL9 between the two outermost word lines WL1 and WL9.

A first select transistor D-TR which is on-off controlled by the first select line DSL is a transistor which has only a gate electrode coupled with the first select line DSL and does not include a floating gate FG. A second select transistor S-TR which is on-off controlled by the second select line SSL is a transistor which has only a gate electrode coupled with the second select line SSL and does not include a floating gate FG.

The first select transistor D-TR serves as a switch which turns on or off the coupling between a corresponding string STR and the data register 430. The second select transistor S-TR serves as a switch which turns on or off the coupling between the corresponding string STR and a source line SL. That is, the first select transistor D-TR and the second select transistor S-TR are positioned at both ends of the corresponding string STR, and serve as gatekeepers which couple and decouple signals.

In a program operation, because it is necessary to fill electrons in a target memory cell MC of a bit line BL which is to be programmed, the memory system 100 turns on the first select transistor D-TR by applying a predetermined turn-on voltage Vcc to the gate electrode of the first select transistor D-TR, and turns off the second select transistor S-TR by applying a predetermined turn-off voltage (e.g., 0V) to the gate electrode of the second select transistor S-TR.

In a read operation or a verify operation, the memory system 100 turns on both the first select transistor D-TR and the second select transistor S-TR. Accordingly, since current may be discharged to the source line SL corresponding to the ground through the corresponding string STR, a voltage level of the bit line BL may be measured. However, in the read operation, there may be a time difference between on-off timings of the first select transistor D-TR and the second select transistor S-TR.

In an erase operation, the memory system 100 may supply a predetermined voltage (e.g., +20V) to a substrate through the source line SL. In the erase operation, the memory system 100 floats both the first select transistor D-TR and the second select transistor S-TR, thereby providing infinite resistance. Accordingly, the memory system 100 is structured such that the first select transistor D-TR and the second select transistor S-TR do not function, and electrons may operate due to a potential difference only between a floating gate FG and the substrate.

Figure 5:
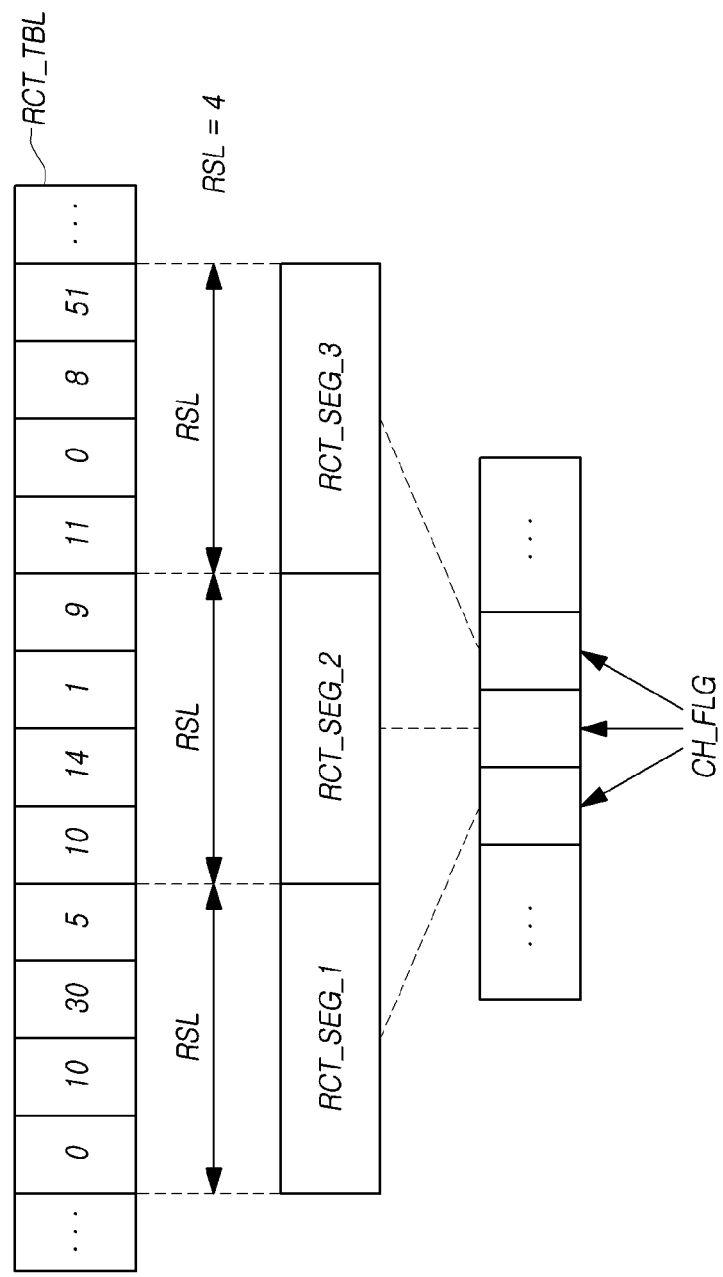
FIG. 5 is a diagram illustrating an example of a schematic operation of the memory system in accordance with the embodiments of the disclosure.

FIG. 5 is a diagram illustrating an example of a schematic operation of the memory system 100 in accordance with the embodiments of the disclosure.

The memory controller 120 of the memory system 100 may divide a read count table RCT_TBL, including read count values respectively for the plurality of memory blocks included in the memory device 110, into one or more read count table segments.

For example, the read count table RCT_TBL may be positioned in the working memory 125 of the memory controller 120.

Each read count table segment RCT_SEG may include read count values. The number of read count values for each read count table segment is a specific resolution RSL.

For example, referring to FIG. 5, the resolution RSL is 4 since there are four read count values in the RSL. The memory controller 120 may divide the read count table RCT_TBL into read count table segments RCT_SEG_1, RCT_SEG_2 and RCT_SEG_3 each including four read count values as the resolution RSL. While FIG. 5 illustrates as an example that the resolution RSL is 4, it is to be noted that the resolution RSL is not limited to a specific value in the embodiments of the disclosure.

The memory controller 120 manages one or more flags CH_FLG respectively corresponding to the aforementioned read count table segments RCT_SEG_1, RCT_SEG_2 and RCT_SEG_3.

Each flag CH_FLG corresponding to each read count table segment RCT_SEG indicates whether at least one of read count values included in the read count table segment RCT_SEG is changed and the changed read count value is recorded in the memory device 110.

The memory controller 120 sets a flag CH_FLG corresponding to a read count table segment RCT_SEG between a time point at which at least one read count value included in the read count table segment RCT_SEG is changed and a time point at which the corresponding read count value is recorded in the memory device 110. Therefore, the fact that a flag CH_FLG corresponding to a read count table segment RCT_SEG is set means that the read count table segment RCT_SEG needs to be recorded in the memory device 110.

On the other hand, the memory controller 120 resets a flag CH_FLG corresponding to a read count table segment RCT_SEG if there is no changed read count value within the corresponding read count table segment RCT_SEG or after all of changed read count values are recorded in the memory device 110.

Hereinafter, with reference to FIG. 6, an operation for the memory controller 120 to set flags CH_FLG in the case where some parts of the read count table RCT_TBL are changed will be described in detail.

Figure 6:
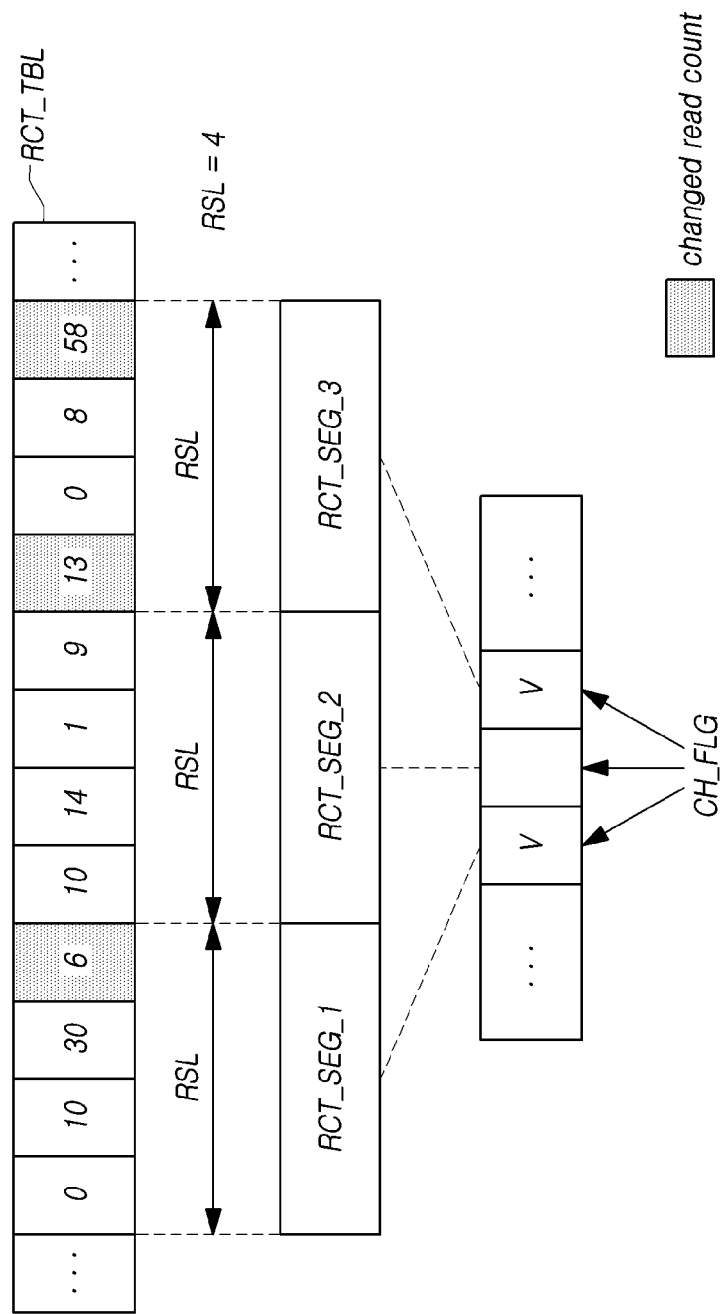
FIG. 6 is a diagram illustrating an example of an operation in the case where some parts of a read count table illustrated in FIG. 5 are changed.

FIG. 6 is a diagram illustrating an example of an operation when some parts of the read count table RCT_TBL illustrated in FIG. 5 are changed.

Referring to FIG. 6, among read count values included in the read count table RCT_TBL, one of the read count values included in the read count table segment RCT_SEG_1 is changed from 5 to 6, and one of read count values included in the read count table segment RCT_SEG_3 is changed from 11 to 13 and another read count value is changed from 51 to 58.

In this case, the memory controller 120 sets the flag CH_FLG corresponding to the read count table segment RCT_SEG_1 and sets the flag CH_FLG corresponding to the read count table segment RCT_SEG_3.

In contrast, the memory controller 120 does not set the flag CH_FLG corresponding to the read count table segment RCT_SEG_2. This is because there is no changed read count value among read count values included in the read count table segment RCT_SEG_2.

The reason why, as described above with reference to FIGS. 5 and 6, a read count table is divided into one or more read count table segments RCT_SEGs each including read count values of a resolution and the change of each read count table segment RCT_SEG is checked is as follows.

Each read count value included in the read count table corresponds to one of the plurality of memory blocks included in the memory device 110. Therefore, as the number of memory blocks included in the memory device 110 increases, the size of the read count table increases as well.

If the size of the read count table increases in this way, the size of a space for storing information indicating whether the respective read count values included in the read count table are changed increases as well. That is, the size of a space needed to store information indicating whether the read count table is changed increases.

Moreover, a time required for the memory controller 120 to record read count values changed among the read count values included in the read count table, in the memory device 110, also increases. This is because the memory controller 120 should check all the read count values included in the read count table.

Thus, instead of checking whether each of the read count values included in the read count table is changed and then recording a changed read count value in the memory device 110, each read count table segment RCT_SEG is checked and a changed read count table segment RCT_SEG is recorded in the memory device 110.

Through this, an advantageous effect is achieved in that the size of a space needed for the memory controller 120 to store information indicating whether the read count table is changed decreases.

In addition, an advantageous effect is achieved in that a time required for the memory controller 120 to record read count values changed among the read count values included in the read count table, in the memory device 110, also decreases. This is because the memory controller 120 does not need to check the respective read count values included in each read count table segment RCT_SEG and is able to record each read count table segment RCT_SEG in the memory device 110 at once.

The number of read count values for a resolution RSL, as described above with reference to FIGS. 5 and 6, may be determined by various methods.

For example, the memory controller 120 may determine the resolution to a preset value or an arbitrary value.

For another example, the memory controller 120 may determine the resolution depending on a level to which emergency power is supplied to the memory controller 120 when a sudden power off (SPO) occurs. This will be described below in detail with reference to FIGS. 7 and 8.

Figure 7:
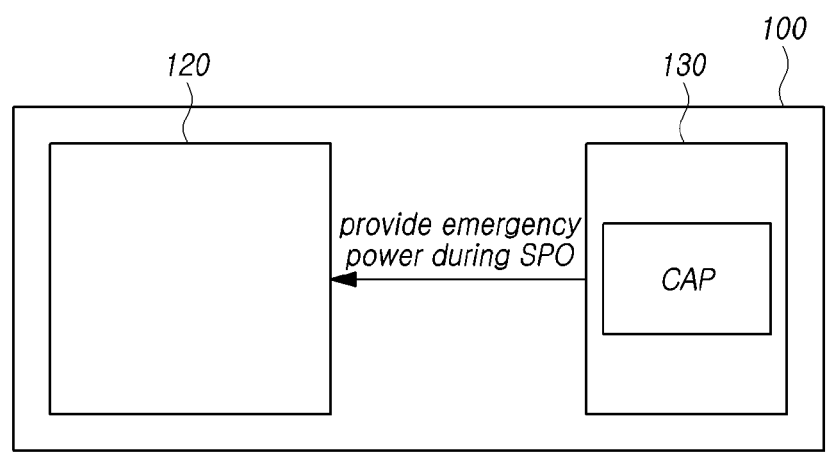
FIG. 7 is a diagram illustrating an example of an operation in the case where an SPO occurs in the memory system in accordance with the embodiments of the disclosure.

FIG. 7 is a diagram illustrating an example of an operation when an SPO occurs in the memory system 100 in accordance with the embodiments of the disclosure.

The memory system 100 may further include a power supply device 130 which supplies emergency power to the memory controller 120 when an SPO occurs.

The power supply device 130 may include a capacitor CAP therein, and may charge electric charge in the capacitor CAP while the memory system 100 operates based on power supplied to the memory system 100.

When an SPO occurs, the power supply device 130 may supply emergency power to the memory controller 120 by using the electric charge charged in the capacitor CAP so that the memory controller 120 does not suddenly stop an operation. Therefore, even when the SPO occurs, the memory controller 120 may perform an additional operation for stabilizing the memory system 100 (e.g., an operation of backing up meta information such as L2P logical to physical (L2P) information and VPT valid page table information), by using the emergency power supplied from the power supply device 130.

In this case, the resolution RSL described above with reference to FIGS. 5 and 6 may be changed depending on the charge capacity of the power supply device 130.

Figure 8:
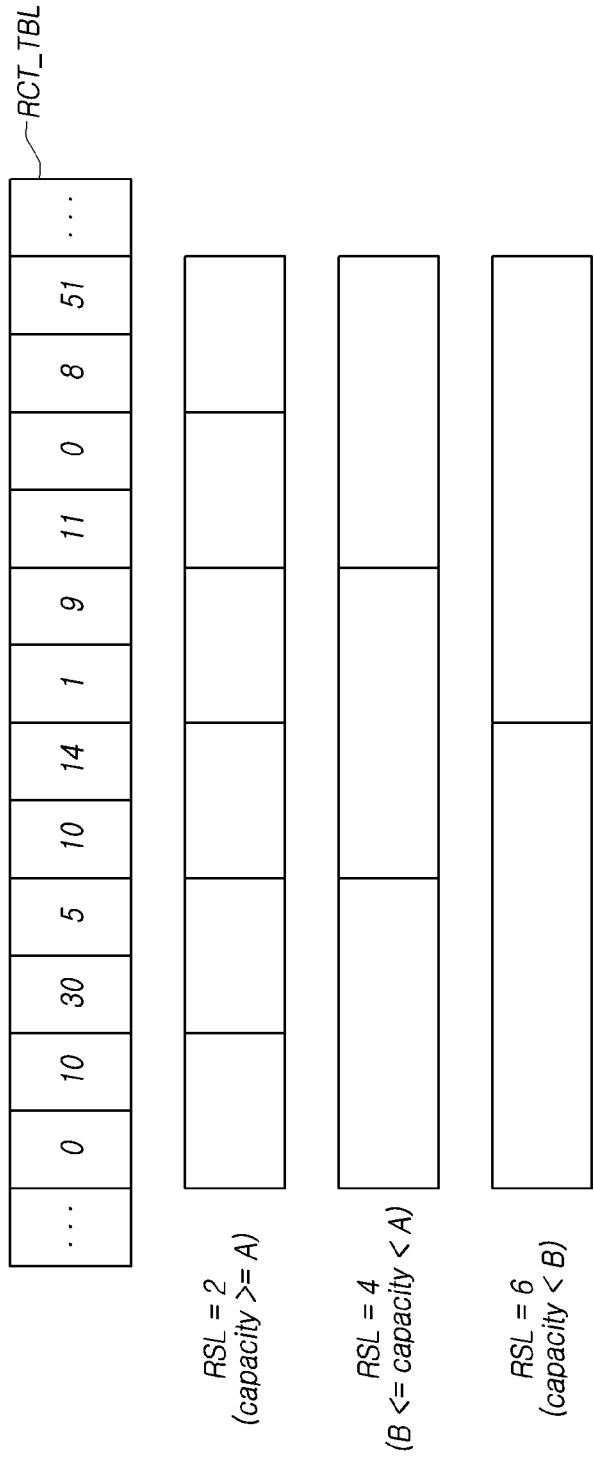
FIG. 8 is a diagram illustrating an example of a resolution depending on charge capacity of a power supply device of FIG. 7.

FIG. 8 is a diagram illustrating an example of a resolution RSL depending on the charge capacity of the power supply device 130 of FIG. 7.

Referring to FIG. 8, when the charge capacity of the power supply device 130 is equal to or greater than a value A, a resolution RSL is determined to be 2. In other words, two read count values are included in one read count table segment RCT_SEG.

In the case where the charge capacity of the power supply device 130 is less than the value A and equal to or greater than a value B, a resolution RSL is determined to be 4. In other words, four read count values are included in one read count table segment RCT_SEG.

When the charge capacity of the power supply device 130 is less than the value B, a resolution RSL is determined to be 6. In other words, six read count values are included in one read count table segment RCT_SEG.

A reason why a resolution RSL is increased as the charge capacity of the power supply device 130 decreases is as follows.

The memory controller 120 should record changes in the read count table RCT_TBL in the memory device 110 within a time during which emergency power is supplied from the power supply device 130 when an SPO occurs.

Therefore, if the charge capacity of the power supply device 130 decreases, the memory controller 120 should record changes in the read count table RCT_TBL in the memory device 110 within a short time. Therefore, the memory controller 120 may increase a resolution RSL and thereby record an increased number of changed read count table segments RCT_SEGs in the memory device 110 in a time period, and through this, may reduce a total time required to record changes in the read count table RCT_TBL in the memory device 110.

Hereinafter, a detailed operation for the memory controller 120 to record read count table segments RCT_SEGs in the memory device 110 will be described.

The expression that the memory controller 120 records read count table segments RCT_SEGs in the memory device 110 may be replaced with the expression that the memory controller 120 stores or dumps read count table segments RCT_SEGs into the memory device 110.

Figure 9:
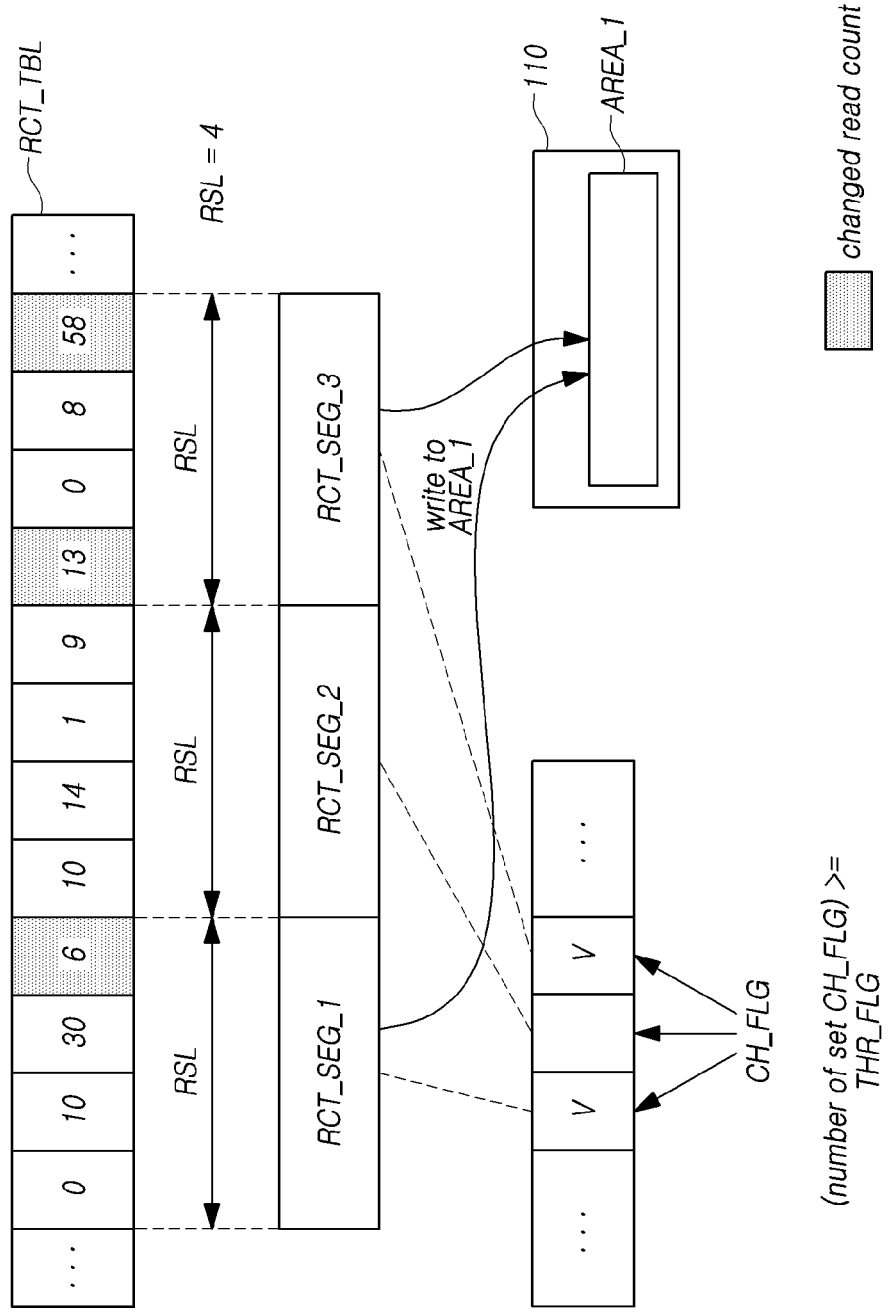
FIG. 9 is a diagram illustrating an example of an operation of recording some of read count table segments of FIG. 6 in a first area.

FIG. 9 is a diagram illustrating an example of an operation of recording some of the read count table segments RCT_SEG_1, RCT_SEG_2 and RCT_SEG_3 of FIG. 6 in a first area AREA_1.

When the number of set flags CH_FLG among the flags CH_FLG respectively corresponding to the read count table segments RCT_SEG_1, RCT_SEG_2 and RCT_SEG_3 is equal to or greater than a threshold THR_FLG, the memory controller 120 may record at least one read count table segment RCT_SEG corresponding to the set flags CH_FLG, in the first area AREA_1.

In FIG. 9, the threshold THR_FLG is 2.

Referring to FIG. 9, among the flags CH_FLG respectively corresponding to the read count table segments RCT_SEG_1, RCT_SEG_2 and RCT_SEG_3, the number of set flags CH_FLG is 2 which is equal to or greater than the threshold THR_FLG being 2. Thus, the memory controller 120 may record the read count table segments RCT_SEG_1 and RCT_SEG_3 corresponding to the set flags CH_FLG, in the first area AREA_1.

While it is described with reference to FIG. 9 that the memory controller 120 records both the two read count table segments RCT_SEG_1 and RCT_SEG_3 corresponding to the set flags CH_FLG, in the first area AREA_1, it is to be noted that the memory controller 120 may record only one of the two read count table segments RCT_SEG_1 and RCT_SEG_3, in the first area AREA_1.

When at least two read count table segments RCT_SEG_1 and RCT_SEG_3 are recorded in the first area AREA_1 as illustrated in FIG. 9, the memory controller 120 may determine, in various ways, priorities as a reference for determining which read count table segment RCT_SEG is to be preferentially recorded in the first area AREA_1.

For instance, the memory controller 120 may determine a priority for recording a read count table segment RCT_SEG in the first area AREA_1, based on the number of changed read count values for each of read count table segments RCT_SEGs corresponding to set flags CH_FLG (that is, how many changed read count values each read count table segment RCT_SEG includes).

In FIG. 9, the read count table segment RCT_SEG_1 has the number of changed read count values of 1, and the read count table segment RCT_SEG_3 has the number of changed read count values of 2. Therefore, the read count table segment RCT_SEG_3 has a higher priority than the read count table segment RCT_SEG_1. Hence, the memory controller 120 may record the read count table segment RCT_SEG_3 in the first area AREA_1 earlier than the read count table segment RCT_SEG_1.

While the first area AREA_1 described above may be set as any area in the memory device 110, it is to be noted that the first area AREA_1 may also be set as an area where a specific type of data is stored.

Figure 10:
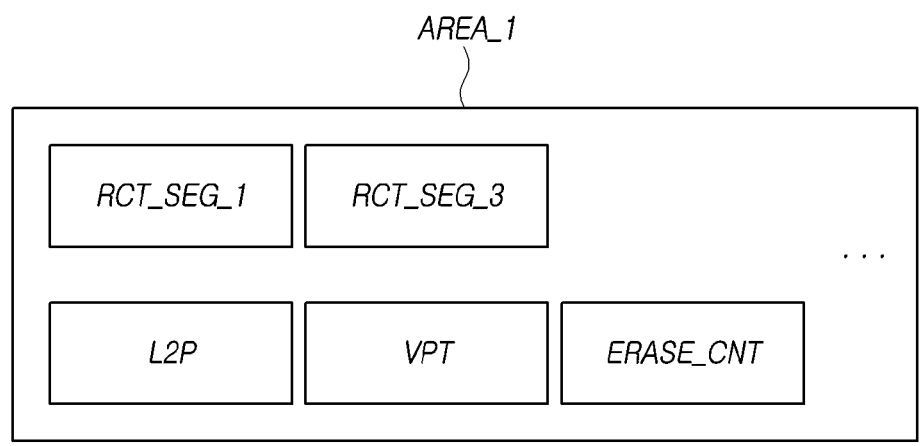
FIG. 10 is a diagram illustrating an example of data stored in the first area of FIG. 9.

FIG. 10 is a diagram illustrating an example of data stored is in the first area AREA_1 of FIG. 9.

The first area AREA_1 may be an area where meta information on user data stored in the memory device 110 is stored.

Referring to FIG. 10, as described above with reference to FIG. 9, the memory controller 120 may record the read count table segments RCT_SEG_1 and RCT_SEG_3 described above with reference to FIG. 9, in the first area AREA_1.

Other meta information may be stored in the first area AREA_1 in addition to the read count table segments RCT_SEG_1 and RCT_SEG_3 described above.

For example, logical to physical (L2P) information indicating mapping relationships between logical addresses and physical addresses for user data may be stored in the first area AREA_1.

For another example, valid page table (VPT) information indicating whether each of a plurality of pages included in each of the plurality of memory blocks included in the memory device 110 is valid (that is, is referable by the host) may be stored in the first area AREA_1.

For still another example, information on an erase count ERASE_CNT indicating how many times each of the plurality of memory blocks included in the memory device 110 is erased may be stored in the first area AREA_1.

An operation of recording some of read count table segments RCT_SEGs in the first area AREA_1 was described above with reference to FIGS. 9 and 10. Hereinafter, an operation after recording some of read count table segments RCT_SEGs in the first area AREA_1 will be described.

Figure 11:
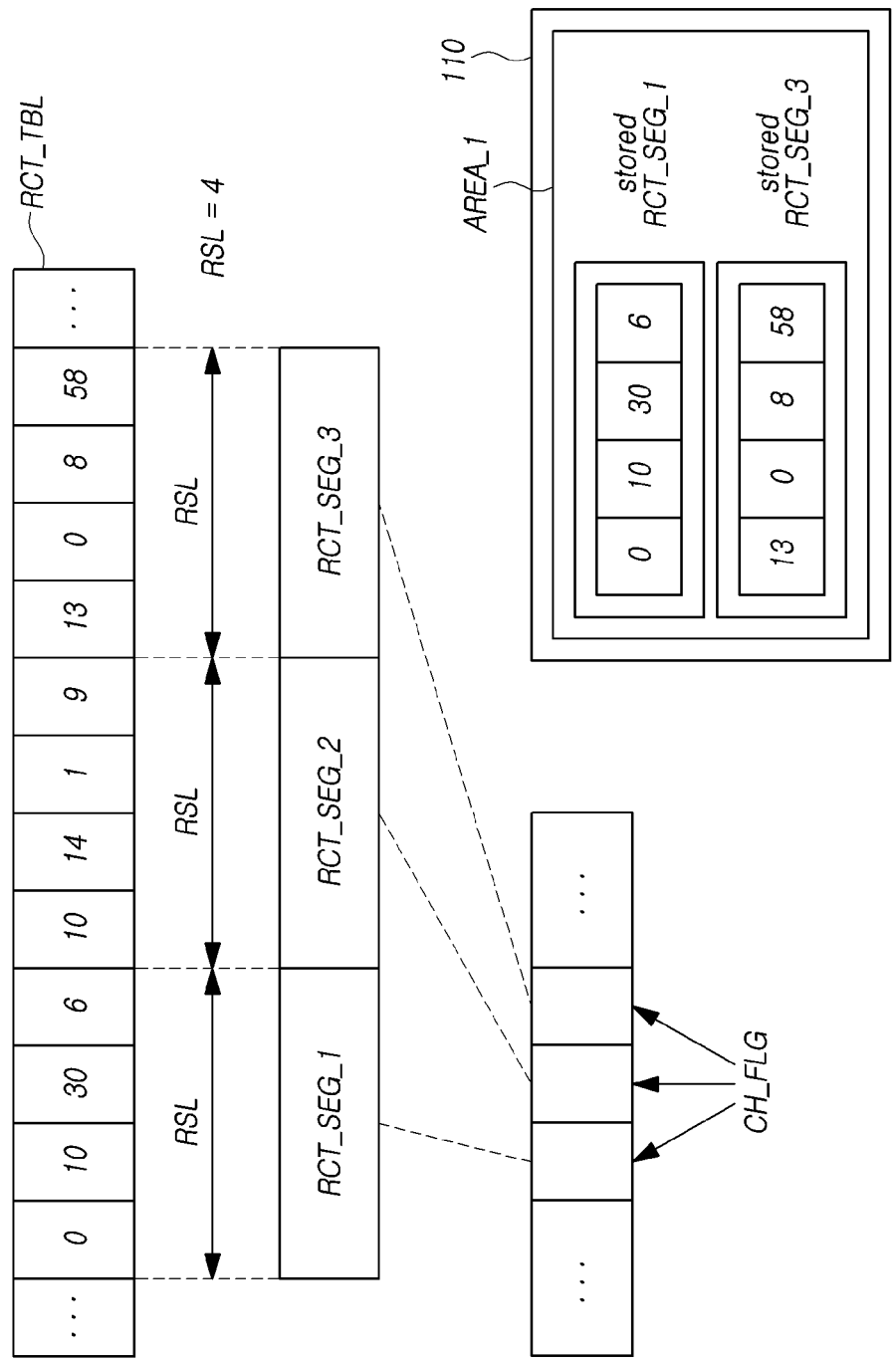
FIG. 11 is a diagram illustrating an example of an operation after recording some of the read count table segments in the first area in FIG. 9.

FIG. 11 is a diagram illustrating an example of an operation after recording some of the read count table segments RCT_SEGs in the first area AREA_1 in FIG. 9.

The memory controller 120 resets the set flags CH_FLG corresponding to the read count table segments RCT_SEG_1 and RCT_SEG_3 which are recorded in the first area AREA_1.

In FIG. 11, the change contents of the read count table segments RCT_SEG_1 and RCT_SEG_3 have already been recorded in the first area AREA_1 of the memory device 110. Therefore, in order to indicate that, in the read count table segments RCT_SEG_1 and RCT_SEG_3, there are no change contents not recorded in the memory device 110, the memory controller 120 may reset the set flags CH_FLG corresponding to the read count table segments RCT_SEG_1 and RCT_SEG_3.

With reference to FIGS. 9 to 11, a case where the memory controller 120 records read count table segments RCT_SEGs whose flags CH_FLG are set, in the memory device 110, while the memory controller 120 normally operates was described above.

In this way, by recording, in the memory device 110, read count table segments RCT_SEGs whose flags CH_FLG are set, the memory controller 120 may maintain the number of read count table segments RCT_SEGs whose flags CH_FLG are set, to be equal to or less than the threshold THR_FLG.

Thus, when an SPO occurs, the memory controller 120 needs to record only read count table segments RCT_SEGs the number of which is equal to or less than the threshold THR_FLG, in the memory device 110. Therefore, operational cost required for the memory controller 120 to record read count table segments RCT_SEGs in the memory device 110 when an SPO occurs (e.g., operational cost required for the power supply device 130 to secure charge capacity necessary to supply emergency power to the memory controller 120 when an SPO occurs) may be reduced. As a consequence, it is possible to minimize additional operational costs required to recover a read count table upon occurrence of an SPO.

Hereinafter, a case where the memory controller 120 records read count table segments RCT_SEGs whose flags CH_FLG are set, when an SPO occurs, will be described.

Figure 12:
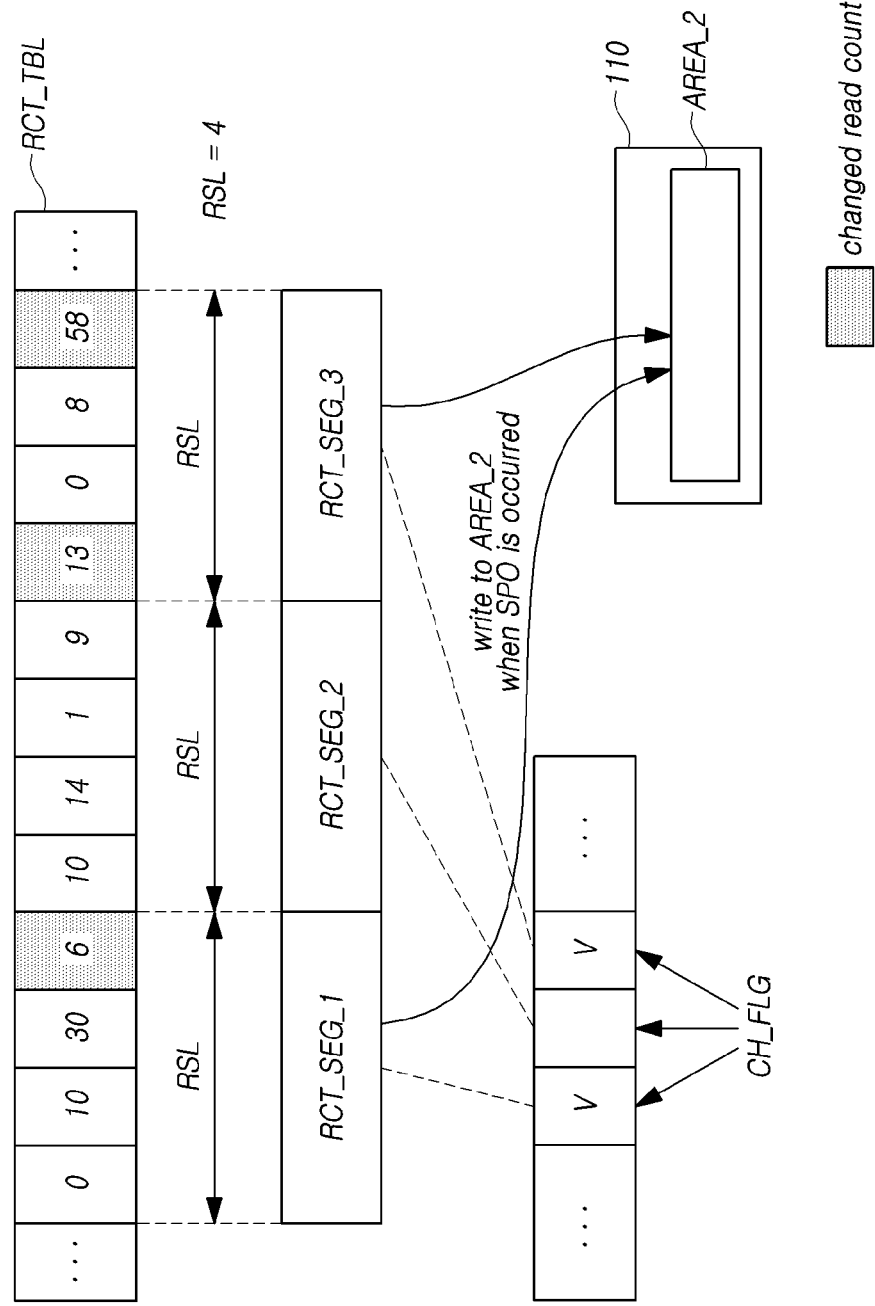
FIG. 12 is a diagram illustrating an example of an operation of recording some of the read count table segments of FIG. 9 in a second area when an SPO occurs.

FIG. 12 is a diagram illustrating a representation of an example of an operation of recording some of the read count table segments RCT_SEGs of FIG. 9 in a second area AREA_2 when an SPO occurs.

Referring to FIG. 12, when an SPO occurs, the memory controller 120 may record the read count table segments RCT_SEG_1 and RCT_SEG_3 corresponding to the set flags CH_FLG corresponding to the respective read count table segments RCT_SEG_1, RCT_SEG_2 and RCT_SEG_3, in a second area AREA_2 in the memory device 110.

The second area AREA_2 may be the same as or different from the first area AREA_1 described above with reference to FIG. 9.

The memory controller 120 may record the read count table segments RCT_SEG_1 and RCT_SEG_3 in the second area AREA_2 in the memory device 110 from after when the SPO occurs to before the memory controller 120 is actually powered down. For example, when an SPO occurs, the memory controller 120 may record the read count table segments RCT_SEG_1 and RCT_SEG_3 in the second area AREA_2 in the memory device 110 for a time period during which emergency power is supplied by the power supply device 130 described above with reference to FIG. 7.

The memory controller 120 may additionally record, in the second area AREA_2, information indicating positions of the read count table segments RCT_SEG_1 and RCT_SEG_3 in the read count table RCT_TBL.

Figure 13:
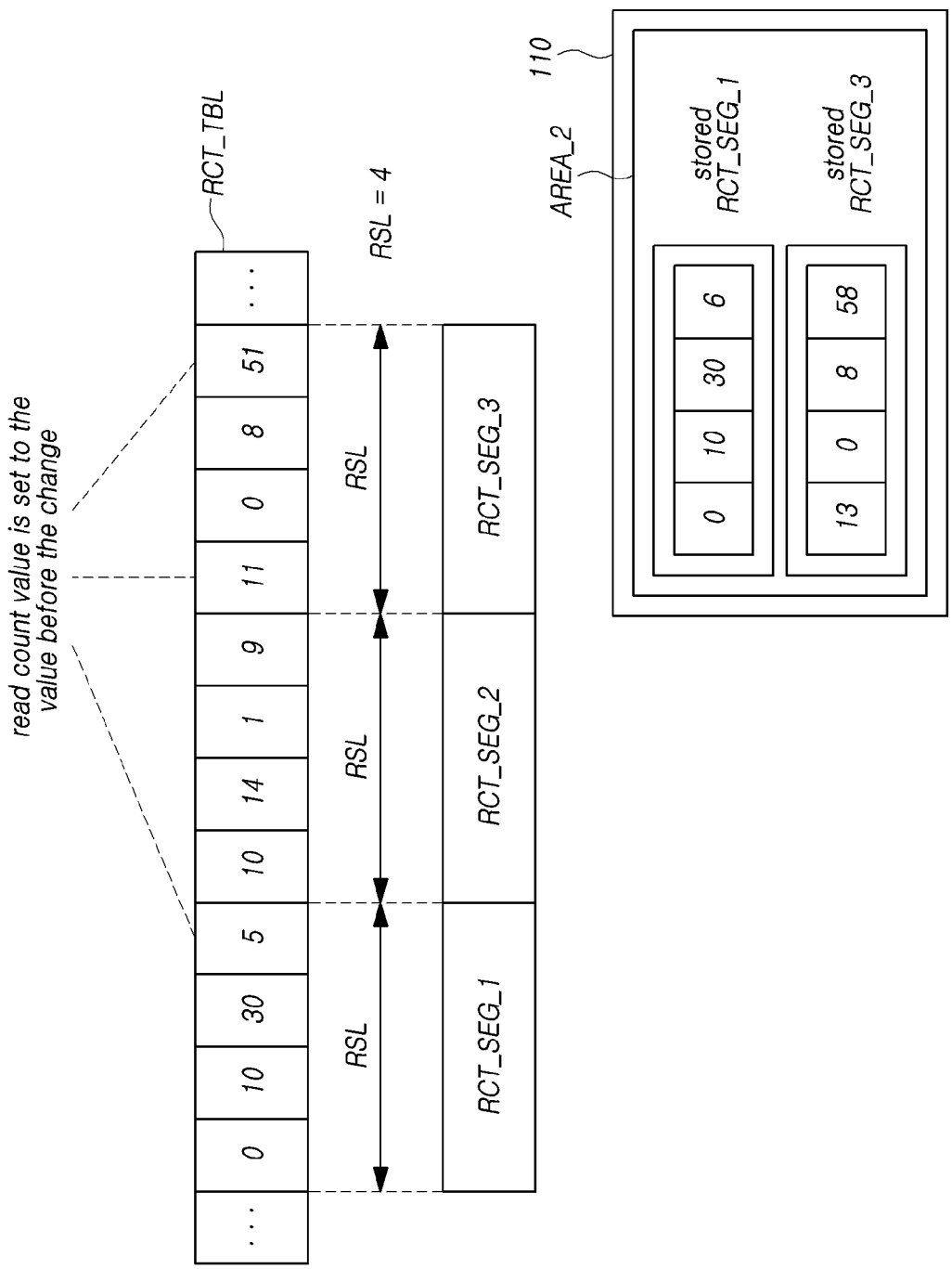
FIG. 13 is a diagram illustrating an example of states of the read count table and the second area after the SPO occurs.

FIG. 13 is a diagram illustrating an example of states of the read count table RCT_TBL and the second area AREA_2 after the SPO occurs.

In FIG. 12, if the memory controller 120 records the read count table segments RCT_SEG_1 and RCT_SEG_3 in the second area AREA_2 in the memory device 110, the read count table segments RCT_SEG_1 and RCT_SEG_3 are recorded in the second area AREA_2 after the SPO occurs. The content of the changed read count value (e.g., from 5 to 6) is recorded in the read count table segment RCT_SEG_1 which was recorded, and the contents of the changed read count values (e.g., from 11 to 13 and from 51 to 58) are recorded in the read count table segment RCT_SEG_3 which was recorded.

On the other hand, after the SPO occurs, the contents of the changed read count values are not recorded in the read count table RCT_TBL. This is because the SPO occurs before the changed read count values are recorded in the memory device 110, and thus, information on the changed read count values is lost.

Therefore, in order to recover the read count table RCT_TBL to a state before the occurrence of the SPO, the memory controller 120 may update the read count table RCT_TBL based on the read count table segments RCT_SEG_1 and RCT_SEG_3 recorded in the second area AREA_2.

The memory controller 120 may perform the update during an SPO recovery operation after the occurrence of the SPO. The SPO recovery operation means an operation of correcting an error which occurred due to the SPO, when power is supplied again to the memory controller 120 after the occurrence of the SPO.

Figure 14:
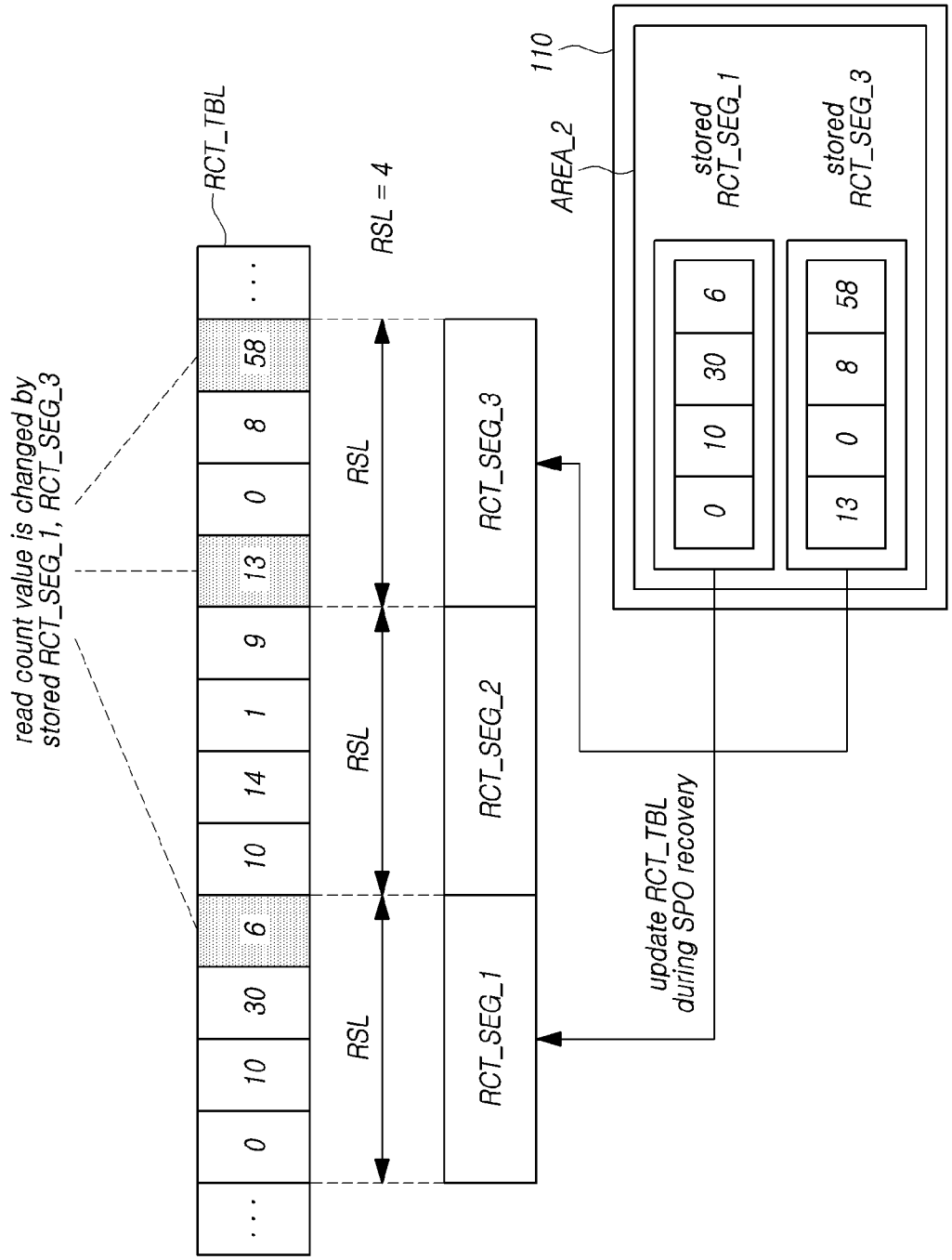
FIG. 14 is a diagram illustrating an example of an operation of updating the read count table based on the read count table segments recorded in the second area, in an SPO recovery operation.

FIG. 14 is a diagram illustrating an example of an operation of updating the read count table RCT_TBL based on the read count table segments RCT_SEGs recorded in the second area AREA_2, in an SPO recovery operation.

The memory controller 120 may update the read count table segment RCT_SEG_1 of the read count table RCT_TBL according to the read count table segment RCT_SEG_1 recorded in the second area AREA_2.

The memory controller 120 may update the read count table segment RCT_SEG_3 of the read count table RCT_TBL according to the read count table segment RCT_SEG_3 recorded in the second area AREA_2.

At this time, the memory controller 120 may use the information, described above with reference to FIG. 12, indicating positions of the read count table segments RCT_SEG_1 and RCT_SEG_3 in the read count table RCT_TBL.

Figure 15:
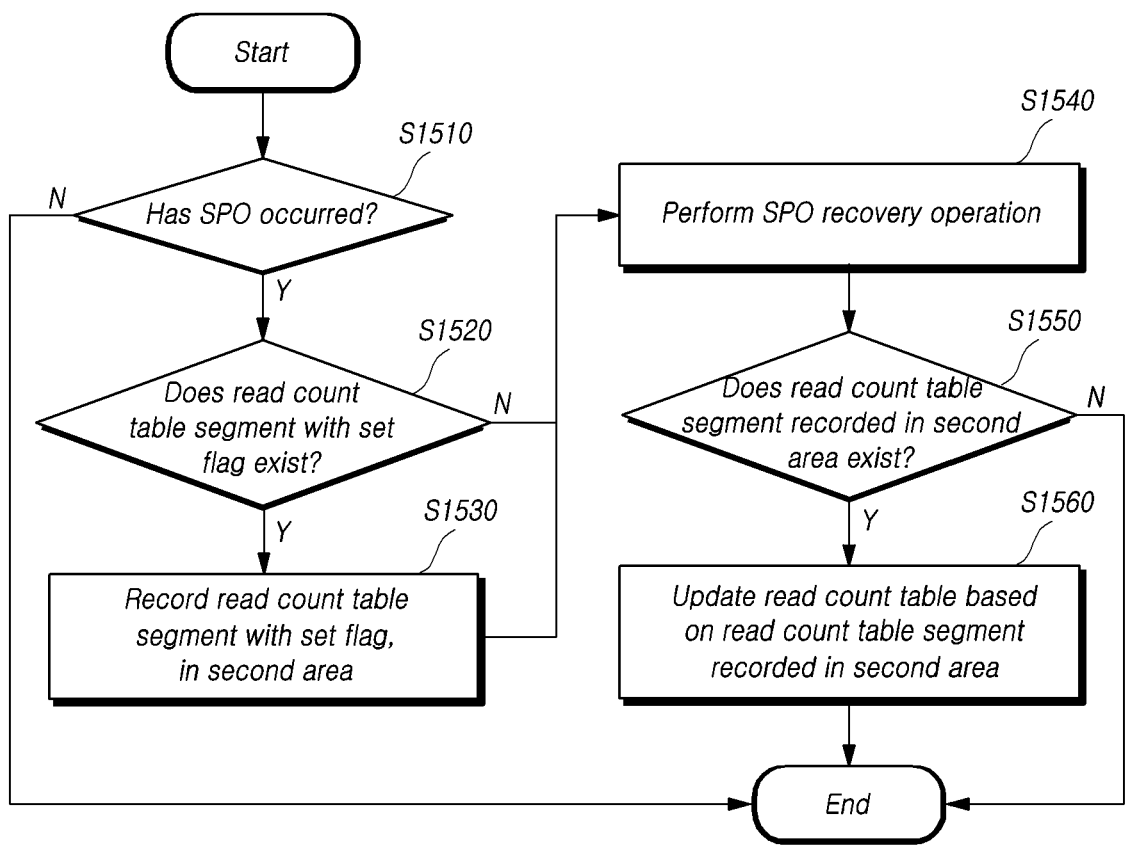
FIG. 15 is a flow chart illustrating an example of an operation in the case where an SPO occurs in the memory system in accordance with the embodiments of the disclosure.

FIG. 15 is a flow chart illustrating an example of an operation in the case where an SPO occurs in the memory system 100 in accordance with the embodiments of the disclosure.

First, the memory controller 120 of the memory system 100 determines whether an SPO has occurred (S1510). For instance, the memory controller 120 may determine that an SPO has occurred, when power supplied to the memory controller 120 decreases below threshold power.

In the case where the memory controller 120 determines that an SPO has occurred (S1510-Y), the memory controller 120 determines whether a read count table segment RCT_SEG whose corresponding flag CH_FLG is set exists among one or more read count table segments RCT_SEGs for a read count table RCT_TBL (S1520).

If a read count table segment RCT_SEG whose flag CH_FLG is set exists (S1520-Y), the memory controller 120 records the read count table segment RCT_SEG whose flag CH_FLG is set, in a second area AREA_2 in the memory device 110 (S1530). Thereafter, the memory controller 120 executes an SPO recovery operation (S1540).

On the other hand, if a read count table segment RCT_SEG whose flag CH_FLG is set does not exist (S1520-N), the memory controller 120 executes the step S1540 since it is not necessary to record a read count table segment RCT_SEG in the second area.

After the step S1540, the memory controller 120 determines whether a read count table segment RCT_SEG recorded in the second area AREA_2 exists (S1550).

In the case where a read count table segment RCT_SEG recorded in the second area AREA_2 exists (S1550-Y), the memory controller 120 may update the read count table RCT_TBL based on the read count table segment RCT_SEG recorded in the second area AREA_2 (S1560).

Figure 16:
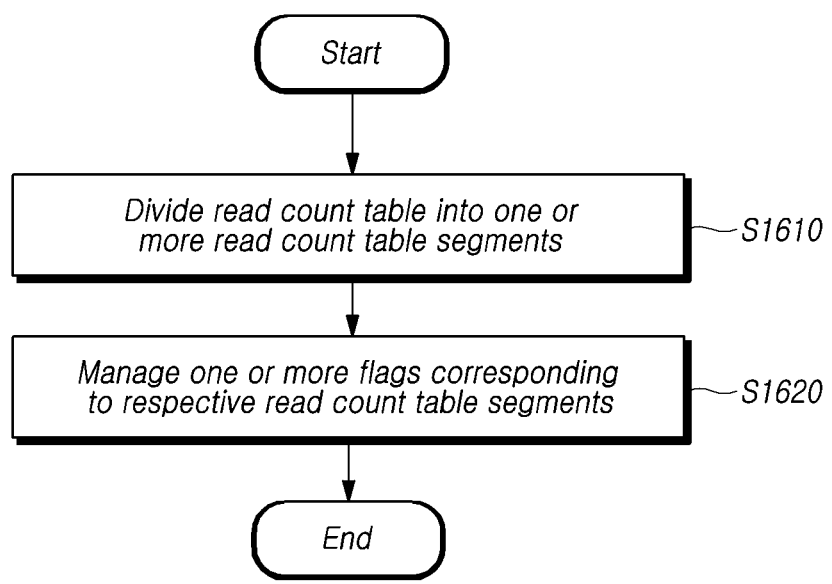
FIG. 16 is a flow chart illustrating an example of a method for operating a memory controller in accordance with the embodiments of the disclosure.

FIG. 16 is a flow chart illustrating an example of a method for operating the memory controller 120 in accordance with the embodiments of the disclosure.

The method for operating the memory controller 120 may include dividing a read count table RCT_TBL including read count values respectively for the plurality of memory blocks included in the memory device 110, into one or more read count table segments RCT_SEGs each including read count values in a resolution (S1610).

The method for operating the memory controller 120 may include managing one or more flags CH_FLG corresponding to the read count table segments RCT_SEGs, respectively (S1620).

At the step S1620, the memory controller 120 may set a flag CH_FLG corresponding to a read count table segment RCT_SEG in which at least one read count value included is changed, among the read count table segments RCT_SEGs.

Moreover, the above-described operation of the memory controller 120 may be controlled by the control circuit 123, and may be performed in such a manner that the processor 124 executes (drives) firmware to which general operations of the memory controller 120 are programmed.

Figure 17:
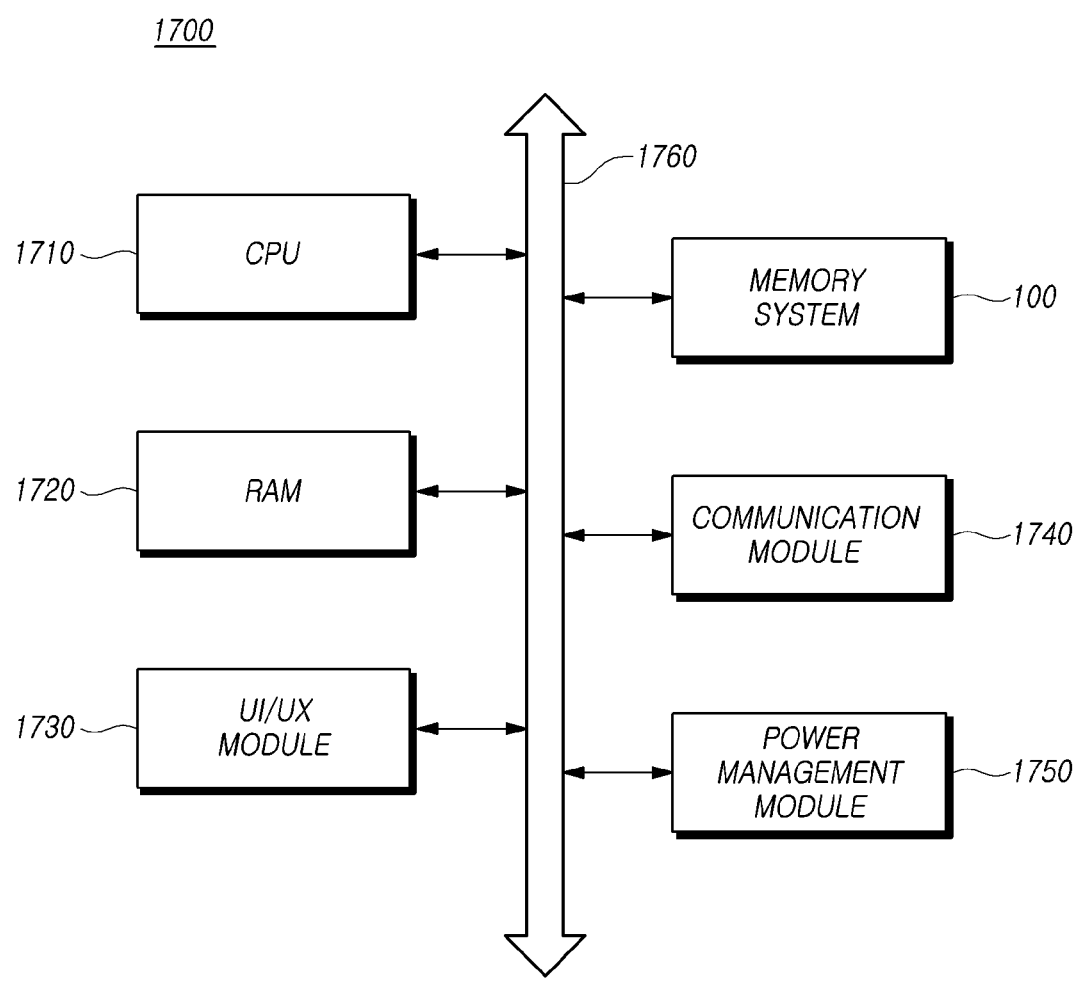
FIG. 17 is a configuration diagram illustrating an example of a computing system in accordance with the embodiments of the disclosure.

FIG. 17 is a configuration diagram illustrating an example of a computing system 1700 in accordance with the embodiments of the disclosure.

Referring to FIG. 17, the computing system 1700 in accordance with the embodiments of the disclosure may include a memory system 100, a central processing unit (CPU) 1710 for controlling general operations of the computing system 1700, a RAM 1720 for storing data and information related with operations of the computing system 1700, a UI/UX (user interface/user experience) module 1730 for providing use environment to a user, a communication module 1740 for communicating with an external device in a wired and/or wireless manner, and a power management module 1750 for managing power used by the computing system 1700, which are electrically coupled to a system bus 1760.

The computing system 1700 may include a PC (personal computer), a mobile terminal such as a smartphone and a tablet or various electronic devices.

The computing system 1700 may further include a battery for supplying an operating voltage, and may further include an application chipset, a graphic-related module, a camera image processor (CIS), a DRAM and so forth. Those skilled in the art will recognize that the computing system 1700 may include other components.

The memory system 100 may include not only a device which stores data in a magnetic disk, such as a hard disk drive (HDD), but also a device which stores data in a nonvolatile memory, such as a solid state drive (SDD), a universal flash storage (UFS) device and an embedded MMC (eMMC) device. The nonvolatile memory may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM). In addition, the memory system 100 may be realized as various types of storage devices, and may be mounted in various electronic devices.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory system comprising:
   a memory device including a plurality of memory blocks; and
   a memory controller configured to:
   divide a read count table including read count values respectively for the plurality of memory blocks into one or more read count table segments each including one or more read count values of a resolution,
   manage one or more flags respectively corresponding to the read count table segments, and
   set the flag corresponding to the read count table segment, in which at least one read count value is changed, among the read count table segments.

2. The memory system according to claim 1,
   further comprising a power supply device configured to supply emergency power to the memory controller when a sudden power off (SPO) occurs,
   wherein the memory controller is further configured to determine a number of the read count values to be included in each of the read count table segments based on charge capacity of the power supply device.

3. The memory system according to claim 1,
   wherein the memory device further includes a first area, and
   wherein the memory controller is further configured to record, when a number of the set flags is equal to or greater than a threshold, the read count table segments corresponding to the set flags in the first area.

4. The memory system according to claim 3, wherein the first area is configured to store meta information on user data stored in the memory device.

5. The memory system according to claim 3, wherein the memory controller is further configured to reset the set flag corresponding to the read count table segment which is recorded in the first area.

6. The memory system according to claim 3, wherein the memory controller is further configured to determine a priority for recording the read count table segments corresponding to the set flags in the first area based on a number of changed read count values within each of the read count table segments corresponding to the set flags.

7. The memory system according to claim 1,
   wherein the memory device further includes a second area, and
   wherein the memory controller is further configured to record, when an SPO occurs, the read count table segments corresponding to set flags in the second area.

8. The memory system according to claim 7, wherein the memory controller is further configured to update, in an SPO recovery operation, the read count table based on the read count table segments recorded in the second area.

9. A memory controller comprising:
   a memory interface configured to communicate with a memory device including a plurality of memory blocks; and
   a control circuit configured to:
   divide a read count table including read count values respectively for the plurality of memory blocks into one or more read count table segments each including one or more read count values of a resolution,
   manage one or more flags respectively corresponding to the read count table segments, and
   set the flag corresponding to the read count table segment, in which at least one read count value is changed, among the read count table segments.

10. The memory controller according to claim 9, wherein the control circuit is further configured to determine a number of the read count values to be included in each of the read count table segments based on charge capacity of a power supply device which supplies emergency power to the memory controller when an sudden power off (SPO) occurs.

11. The memory controller according to claim 9, wherein the control circuit is further configured to record, when a number of the set flags is equal to or greater than a threshold, the read count table segments corresponding to the set flags in a first area in the memory device.

12. The memory controller according to claim 11, wherein the first area is an area in which meta information on user data stored in the memory device is stored.

13. The memory controller according to claim 11, wherein the control circuit is further configured to reset the set flag corresponding to the read count table segment which is recorded in the first area.

14. The memory controller according to claim 11, wherein the control circuit is further configured to determine a priority for recording the read count table segments corresponding to the set flags in the first area based on a number of changed read count values within each of the read count table segments corresponding to the set flags.

15. The memory controller according to claim 9, wherein the control circuit is further configured to record, when an SPO occurs, the read count table segments corresponding to set flags in a second area in the memory device.

16. The memory controller according to claim 15, wherein the control circuit is further configured to update, in an SPO recovery operation, the read count table based on the read count table segments recorded in the second area.

17. A method for operating a memory controller which controls a memory device including a plurality of memory blocks, the method comprising:
- dividing a read count table including read count values respectively for the plurality of memory blocks into one or more read count table segments each including one or more read count values of a resolution;
- managing one or more flags respectively corresponding to the read count table segments; and
- setting the flag corresponding to the read count table segment, in which at least one read count value is changed, among the read count table segments.

* * * * *